United States Patent

Park

(10) Patent No.: US 9,196,655 B2
(45) Date of Patent: Nov. 24, 2015

(54) TRANSISTOR, RESISTANCE VARIABLE MEMORY DEVICE INCLUDING THE SAME, AND MANUFACTURING METHOD THEREOF

(71) Applicant: SK hynix Inc., Gyeonggi-do (KR)

(72) Inventor: Nam Kyun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/634,121

(22) Filed: Feb. 27, 2015

(65) Prior Publication Data

US 2015/0171143 A1 Jun. 18, 2015

Related U.S. Application Data

(62) Division of application No. 13/948,490, filed on Jul. 23, 2013, now abandoned.

(30) Foreign Application Priority Data

Feb. 27, 2013 (KR) .......................... 10-2013-0021164

(51) Int. Cl.
- *H01L 27/24* (2006.01)
- *H01L 29/78* (2006.01)
- *H01L 29/66* (2006.01)
- *H01L 21/8234* (2006.01)

(Continued)

(52) U.S. Cl.
CPC .... *H01L 27/2454* (2013.01); *H01L 21/823487* (2013.01); *H01L 27/101* (2013.01); *H01L 27/228* (2013.01); *H01L 27/2463* (2013.01); *H01L 29/45* (2013.01); *H01L 29/495* (2013.01); *H01L 29/66484* (2013.01); *H01L 29/66666* (2013.01); *H01L 29/7827* (2013.01); *H01L 29/7833* (2013.01); *H01L 29/7835* (2013.01); *H01L 43/02* (2013.01); *H01L 43/08* (2013.01); *H01L 43/12* (2013.01); *H01L 45/06* (2013.01); *H01L 45/08* (2013.01); *H01L 45/1233* (2013.01); *H01L 45/141* (2013.01); *H01L 45/149* (2013.01); *H01L 45/1608* (2013.01)

(58) Field of Classification Search
CPC .... H01L 29/42356; H01L 29/42372–29/4238; H01L 29/66484; H01L 29/66666; H01L 29/66787–29/66818; H01L 29/7827; H01L 29/78642

See application file for complete search history.

(56) References Cited

U.S. PATENT DOCUMENTS

| | | | |
|---|---|---|---|
| 8,207,566 B2 * | 6/2012 | Lee | H01L 29/66666 257/302 |
| 8,722,473 B2 * | 5/2014 | Schulz | H01L 21/823821 257/E21.442 |

(Continued)

*Primary Examiner* — Andres Munoz
(74) *Attorney, Agent, or Firm* — IP & T Group LLP

(57) ABSTRACT

A resistance variable memory device including a vertical transistor includes an active pillar including a channel region, a source formed in one end of the channel region, and a lightly doped drain (LDD) region and a drain formed in the other end of the channel region, a first gate electrode formed to surround a periphery of the LDD region and having a first work function, and a second gate electrode formed to be connected to the first gate electrode and to surround the channel region and having a second work function that is higher than the first work function.

5 Claims, 5 Drawing Sheets

(51) Int. Cl.
*H01L 27/10* (2006.01)
*H01L 27/22* (2006.01)
*H01L 29/45* (2006.01)
*H01L 29/49* (2006.01)
*H01L 43/02* (2006.01)
*H01L 43/08* (2006.01)
*H01L 43/12* (2006.01)
*H01L 45/00* (2006.01)

(56) References Cited

U.S. PATENT DOCUMENTS 8,866,214 B2 * 10/2014 Guo .................... H01L 29/4983
 257/328
2009/0001337 A1 * 1/2009 Furukawa ........... H01L 27/2454
 257/2
2011/0121396 A1 * 5/2011 Lee ...................... G11C 11/403
 257/365

* cited by examiner

TRANSISTOR, RESISTANCE VARIABLE MEMORY DEVICE INCLUDING THE SAME, AND MANUFACTURING METHOD THEREOF

CROSS-REFERENCES TO RELATED APPLICATION

This application is a division of U.S. patent application Ser. No. 13/948,490, filed on Jul. 23, 2013,, which claims priority under 35 U.S.C. 119(a) to Korean application number 10-2013-0021164,, filed on Feb. 27, 2013,, in the Korean Intellectual Property Office, which is incorporated herein by reference in its entirety.

BACKGROUND

1. Technical Field

Exemplary embodiments of the present invention relate to a semiconductor integrated circuit device, and more particularly, to a transistor, and a resistance variable memory device including the same, and a manufacturing method thereof.

2. Related Art

With the rapid development of mobile and digital information communication and consumer-electronic industry, studies on existing electronic charge controlled-devices are expected to encounter the limitation. Thus, new functional memory devices of new concept other than the existing electronic charge devices need to be developed. In particular, next-generation memory devices with large capacity, ultra-high speed, and ultra-low power are in demand.

Currently, resistive memory devices using a resistance device as a memory medium have been suggested as the next-generation memory devices, and some of the examples are phase-change random access memories (PCRAMs), resistance RAMS (ReRAMs), and magentoresistive RAMs (MRAMs).

The resistive memory devices may be basically configured of a switching device and a resistance device and store data "0", or "1" according to a state of the resistance device.

Even in the resistive memory devices, the first priority is to improve an integration density and to integrate most memory cells in a narrow area.

To meet these demands, the resistive memory devices have also adopted three-dimensional (3D) vertical transistor structures.

However, even in the 3D vertical transistors, thin gate insulating layers may be required. Thus, when a high voltage is supplied to a gate, a high electric field is applied to a lightly doped drain (LDD) region and gate induced drain leakage (GIDL) may be caused.

SUMMARY

According to one aspect of an exemplary embodiment of the present invention, a transistor may include an active pillar including a channel region, a source formed in one end of the channel region, and a lightly doped drain (LDD) region and a drain formed in the other end of the channel region, a first gate electrode formed to surround a periphery of the LDD region and having a first work function, and a second gate electrode formed to be connected to the first gate electrode and to surround the channel region, and having a second work function that is higher than the first work function.

According to another aspect of an exemplary embodiment of the present invention, a resistance variable memory device may include a vertical transistor including an active pillar including a channel region, a source formed in one end of the channel region, and a lightly doped drain (LDD) region and a drain formed in the other end of the channel region, a first gate electrode formed to surround a periphery of the LDD region and having a first work function, and a second gate electrode formed to be connected to the first gate electrode and to surround the channel region and having a second work function higher than the first work function, and a resistive memory structure connected to the drain of the vertical transistor.

According to still another aspect of an exemplary embodiment of the present invention, a method of manufacturing a resistance variable semiconductor device may include forming a source region in a semiconductor substrate, forming a semiconductor layer on the source region, patterning the semiconductor layer to form an active pillar, forming a first gate electrode to surround the active pillar, surrounding an upper region of the first gate electrode with an insulating layer while exposing a lower region of the first gate electrode, and forming a second gate electrode by increasing a work function of the exposed first gate electrode.

These and other features, aspects, and embodiments of the present invention are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
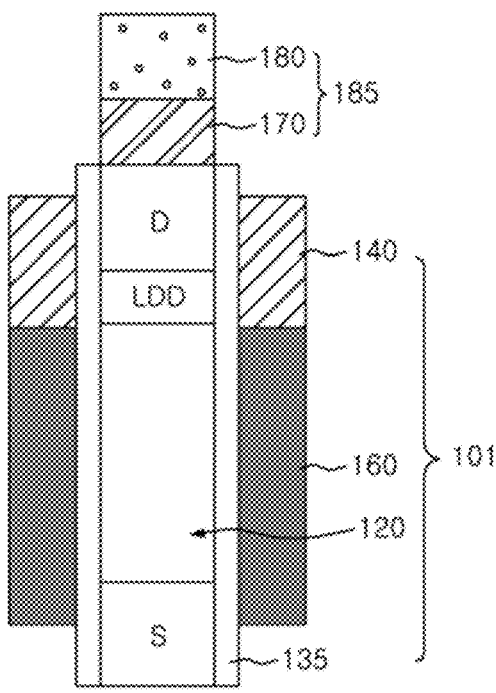
FIG. 1 is a schematic cross-sectional view illustrating a resistance variable memory device including a vertical transistor according to an exemplary implementation of the inventive concept.

Hereinafter, various exemplary embodiments of the present invention will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. It is also noted that in this specification, "connected/coupled" refers to one component not only directly coupling another component but also indirectly coupling another component through an intermediate component. In addition, a singular form may include a plural form as long as it is not specifically mentioned in a sentence.

Referring to FIG. 1, a resistance variable memory device 100 according to an exemplary embodiment may include a vertical transistor 101 and a resistive memory structure 185, The vertical transistor 101 may include an active pillar 120, a first gate electrode 140, and a second gate electrode 160.

A source S may be provided below the active pillar 120 and a drain D is provided on the active pillar 120. The active pillar 120 between the source S and the drain D serves as a channel region of the vertical transistor 101. At this time, the active pillar 120 may be interpreted as a structure including the source S, or the active pillar 120 may have a structure separately formed on the source S. The source S and the active pillar 120 may be semiconductor layers. Further, a lightly doped drain (LDD) region LDD, which is a low concentration impurity region, may be formed in the active pillar 120 between a portion of the active pillar 120 serving as the channel region and the drain D, and thus a short channel effect may be alleviated.

The first gate electrode 140 may be formed to surround around an upper portion of the active pillar 120 in which the LDD region LDD is formed. The first gate electrode 140 may partially overlap a portion of the drain D, but the first gate electrode 140 may be formed substantially on a location of the active pillar 120 corresponding to the LDD region LDD.

The second gate electrode 160 may be connected to the first gate electrode 140 and surround the channel region of the active pillar 120. For example, the second gate electrode 160 may be in contact with the first gate electrode 140 and located below the first gate electrode 140. At this time, the first gate electrode 140 may include a material having a work function lower than that of the second gate electrode 160. That is, when the work function of the first gate electrode 140 overlapping the LDD region LDD is lowered, high electric field characteristics causing GIDL may be alleviated, and thus the GIDL characteristics of the LDD region LDD and the drain D adjacent to the LDD region LDD may be improved.

At this time, a gate insulating layer 135 may be interposed between the first and second gate electrodes 140 and 160 and the active pillar 120. Various insulating layers such a metal oxide layer and a silicon oxide layer may be used as the gate insulating layer 135.

The resistive memory structure 185 may be configured of a lower electrode 170 and a resistive memory layer 180. The lower electrode 170 may be a conductive layer formed on the drain D and provide a current and a voltage to the resistive memory layer 180. Although not illustrated in FIG. 1, an ohmic layer may be interposed between the lower electrode 170 and the drain D depending on material properties of the lower electrode 170. The resistive memory layer 180 may be a layer of which a resistance value is changed according to the voltage and current provided from the lower electrode 170. As the resistive memory layer 180, a PCMO layer that is a material for a Re RAM, a chalcogenide layer that is a material for a PCRAM, a magnetic layer that is a material for a MRAM, a magnetization reversal device layer that is a material for a spin-transfer torque magnetoresistive RAM (STTMRAM), a polymer layer that is a material for a polymer RAM (Po-RAM), or the like, may be variously used.

In the vertical transistor according to the exemplary embodiment, the gate electrode is formed of a material having a relatively lower work function in the LDD region LDD, which has a lower GIDL barrier and a high electric field is applied to, than in the channel region.

As described above, the gate electrode having a relatively low work function is disposed around the LDD region LDD to compensate the low GIDL barrier according to application of the high electric field, and thus leakage current may be reduced.

A method of manufacturing a resistance variable memory device including a vertical transistor will be described in detail with reference to FIGS. 2 to 5.

Figure 2:
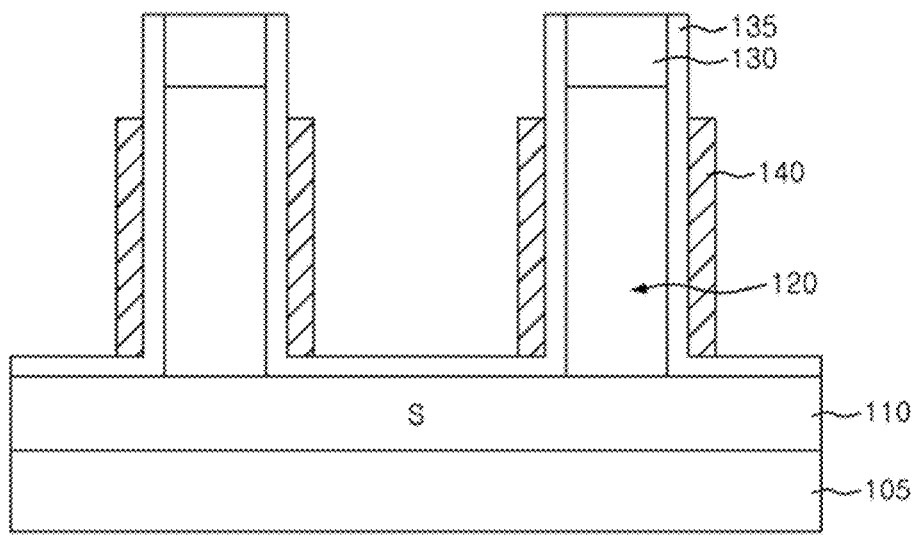
FIGS. 2 to 5 are cross-sectional views sequentially illustrating a process of manufacturing a vertical transistor of a resistance variable memory device according to an exemplary implementation of the inventive concept.

Referring to FIG. 2, a source 110 is formed in a semiconductor substrate 105 by implementing impurities into an upper portion of the semiconductor substrate 105. A semiconductor layer is formed on the semiconductor substrate 105 in which the source 110 is formed. For example, the semiconductor layer may be an impurity-doped polysilicon layer or a layer that epitaxially grows the semiconductor substrate 105 in which the source is formed, A hard mask layer 130, for example, a silicon nitride layer is deposited on the semiconductor layer. Predetermined portions of the hard mask layer 130 and the semiconductor layer are patterned to form a plurality of active pillars 120. A gate insulating layer 135 is formed on surfaces of the plurality of active pillars 120 and the semiconductor substrate 105. As the gate insulating layer 135, a layer in which a conductive material such as silicon (Si), tantalum (Ta), titanium (Ti), barium titanium (BaTi), barium zirconium (BaZr), zirconium (Zr), hafnium (Hf), lanthanum (La), aluminum (Al), yttrium (Y), or zirconium suicide (ZrSi) is oxidized, may be used. A first conductive layer is deposited on the semiconductor substrate 105 including the gate insulating layer 135, and anisotropically etched to surround the active pillar 120. Therefore, a first gate electrode 140 is formed over an outer circumference of each of the active pillar 120 covered with the gate insulating layer 135. At this time, by anisotropic over-etching, the first gate electrode 140 may be formed to have a height lower than that of the active pillar 120. For example, as the first gate electrode 140, a transition metal layer including a metal such as Ti, Ta, cobalt (co), or platinum (Pt) may be used.

Figure 3:
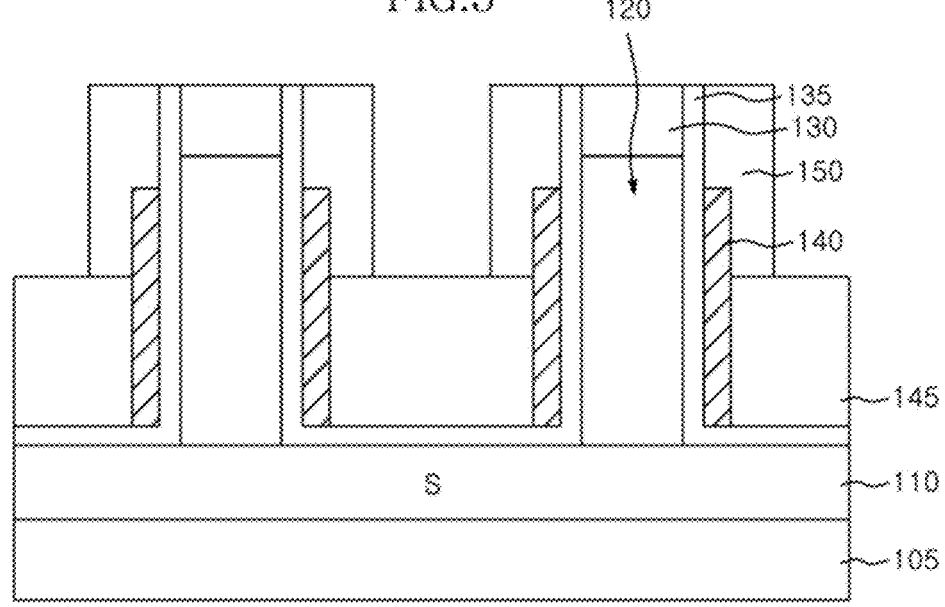

As illustrated in FIG. 3, a first insulating layer 145 is formed to fill a space between the active pillars 120. Next, the first insulating layer 145 is recessed to expose an upper region of the first gate electrode 140. At this time, an upper surface of the first insulating layer 145 may be located to correspond to a channel formation region of the active pillar 120. A second insulating layer 150 is formed to cover the exposed upper region of the first gate electrode 140. The second insulating layer 150 may be formed of a material having an etch selectivity different from that of the first insulating layer 145.

Figure 4:
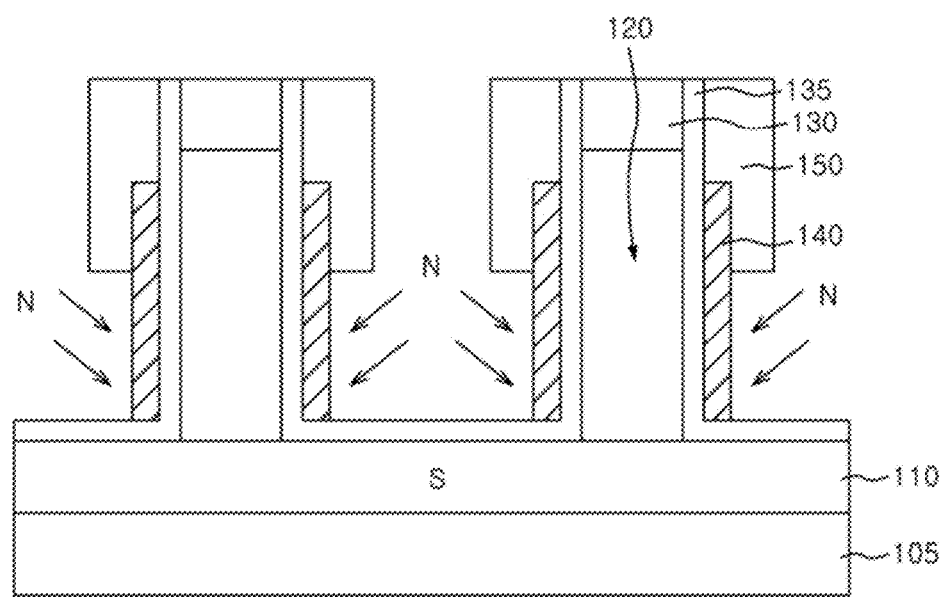
Figure 5:
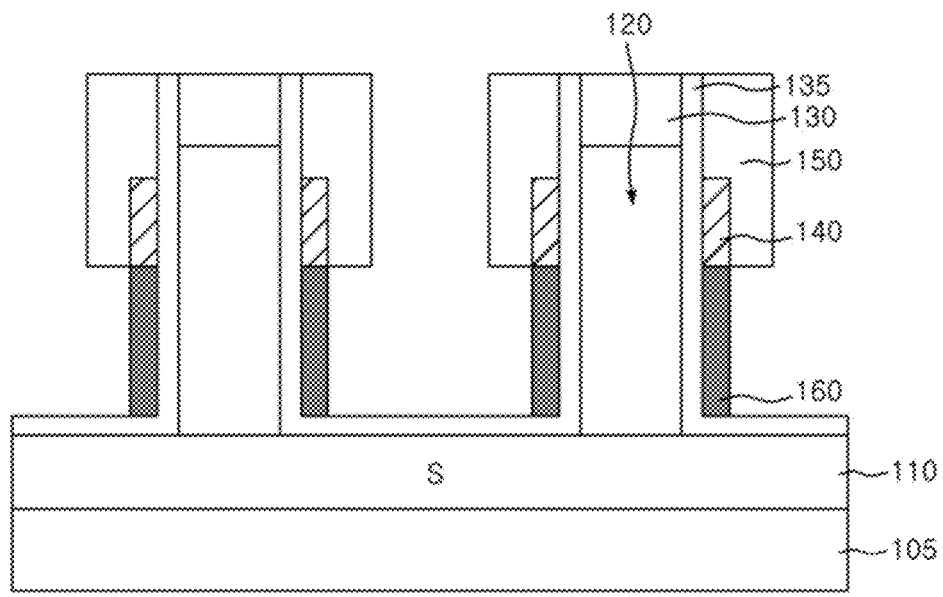

Referring to FIG. 4, the first insulating layer 145 is selectively removed to expose a lower region of the first gate electrode 140. Next, nitrogen ions are implanted into the exposed first gate electrode 140 to form a second gate electrode 160 formed of a metal nitride layer, for example, a titanium nitride (TiN) layer as illustrated in FIG. 5. As known, a refractory metal layer such as a Ti layer has a work function lower than that of a metal nitride layer such as a TiN layer.

Therefore, a portion of the gate electrode corresponding to an LDD region LDD is formed of a material having a relatively low work function, and thus leakage current due to GIDL may be reduced.

Next, referring back to FIG. 1, the hard mask layer 130 on the active pillar 120 is removed, and the LDD region LDD is formed by implanting impurities having a law concentration into the active pillar 120. Subsequently, impurities having a high concentration are implanted in the active pillar 120 in which the LDD region LDD is formed to define a drain D.

A lower electrode 170 and a resistive memory layer 180 are sequentially formed on the drain D to fabricate the resistance variable memory device.

A metal silicide layer other than the metal nitride layer may be used as the second gate electrode 160.

Figure 6:
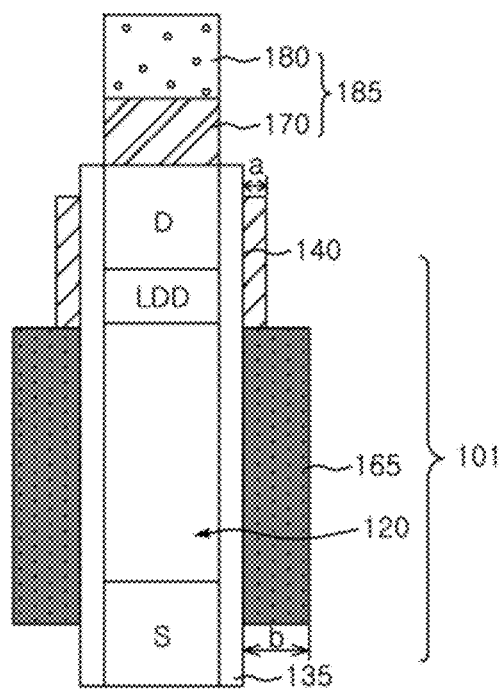
FIG. 6 is a schematic cross-sectional view illustrating a resistance variable memory device including a vertical transistor according to another exemplary implementation of the inventive concept.

That is, as illustrated in FIG. 6, a first gate electrode 140 surrounding the LDD region LDD may be formed of a transition metal layer like examples in the above-described exemplary embodiment, and a second gate electrode 165 may be formed of a transition metal silicide layer located below the first gate electrode 140 and having a work function higher than that of the first gate electrode 140. At this time, a thickness b of the second gate electrode 165 may be larger than a thickness a of the first gate electrode 140.

Since the transition metal layer also has a work function lower than that of the transition metal silicide layer, leakage current around the LDD region LDD having weak GIDL characteristic may be reduced.

A method of manufacturing the vertical transistor illustrated in FIG. 6 will be described in detail with reference to FIGS. 7 and 8. Here, some of the manufacturing method of the resistance variable memory device in the exemplary embodiment are substantially the same as the processes of FIGS. 1 to 3 in the manufacturing method of the resistance variable memory device in the above-described exemplary embodiment, and thus processes subsequent to the process of FIG. 3 will be described.

Figure 7:
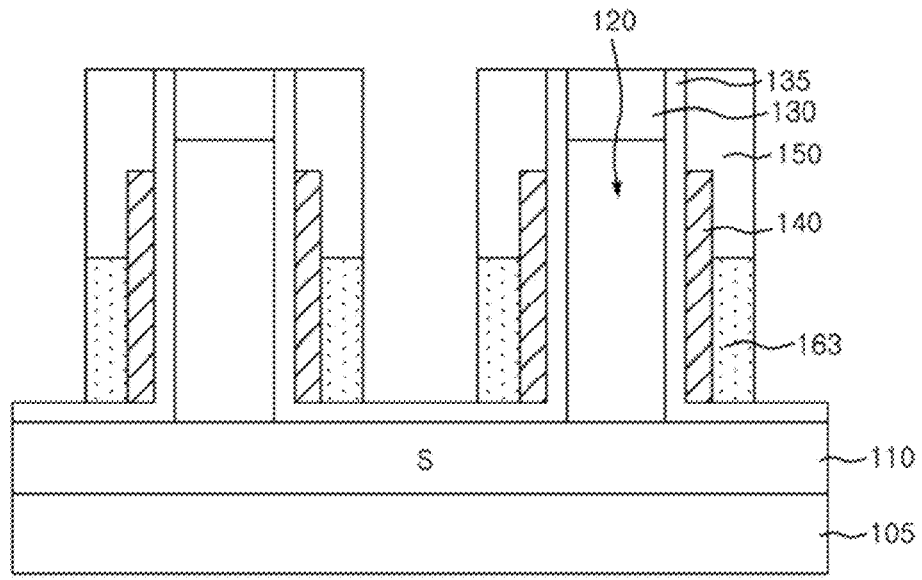
FIGS. 7 and 8 are cross-sectional views sequentially illustrating a process of manufacturing a vertical transistor of FIG. 6.

Referring to FIG. 7, the first insulating layer (145 of FIG. 3) is selectively removed to expose a sidewall of the first gate electrode 140. A silicon layer 163 is deposited on an exposed surface of the first gate electrode 140 to a predetermined thickness. The silicon layer 163 may be formed to be located below a second insulating layer 150.

Figure 8:
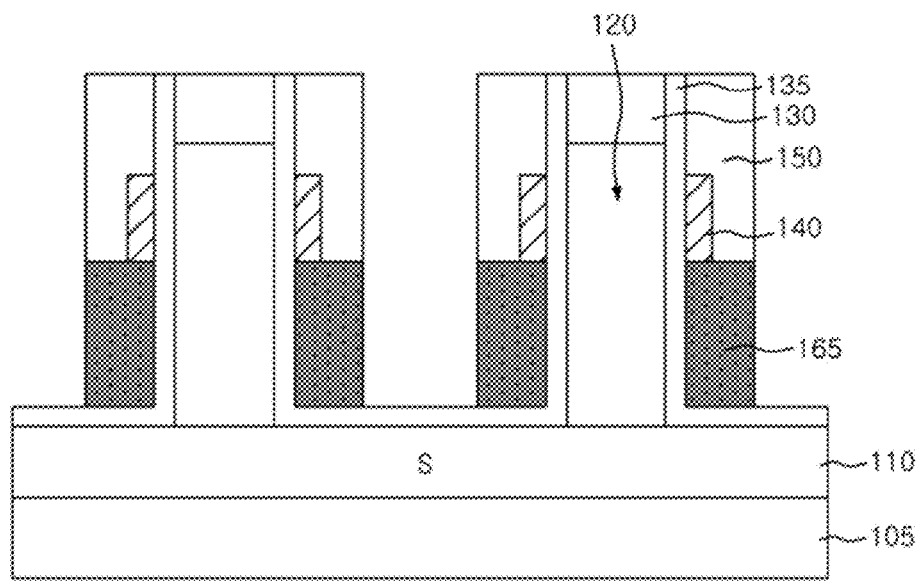

Referring to FIG. 8, a heat treatment is performed on the semiconductor substrate 105 so that the first gate electrode 140 is reacted with the silicon layer 163 in contact with the first gate electrode 140 to form the second gate electrode 165 formed of a transition metal silicide layer. At this time, since the second gate electrode 165 is a layer formed through the heat reaction of the first gate electrode 140 with the silicon layer 163, a thickness of the silicon layer 163 may be provided as a thickness of the second gate electrode 165. Therefore, the second gate electrode 165 may have a thickness larger than that of the first gate electrode 140.

Figure 9:
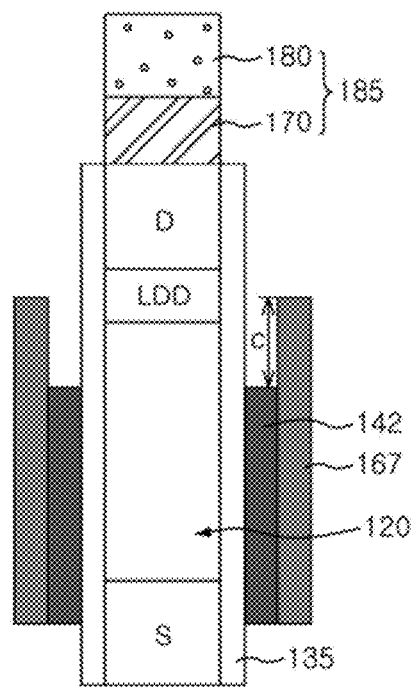
FIG. 9 is a schematic diagram illustrating a vertical transistor according to another exemplary implementation of the inventive concept; and vertical transistor according to another exemplary implementation of the inventive concept.

As illustrated in FIG. 9, first and second gate electrodes 142 and 167 may be sequentially formed to surround an active pillar 120.

That is, the first gate electrode 142 is formed to surround an outer circumference of the active pillar 120 covered with the gate insulating layer 135. At this time, it is important that the first gate electrode 142 is formed not to overlap an LDD region LDD.

Next, the second gate electrode 167 is formed to surround an outer circumference of the gate electrode 142. At this time, the second gate electrode 167 may extend by a predetermined length c more than the first gate electrode 142 so that the second gate electrode 167 overlap a portion of the LDD region LDD. Therefore, for example, only a portion of the insulating layer 135 is present between the LDD region LDD and the second gate electrode 167 without interposing of the first gate electrode 142. Here, the second gate electrode 167 may have a work function higher than that of the first gate electrode 142. However, in some cases, the second gate electrode 167 may be formed of a material having a work function similar to or lower than that of the first gate electrode 142.

In the vertical transistor having the above-described structure, since the first gate electrode 142 is formed to have a relatively low work function and a distance between the LDD region LDD and the second gate electrode 167 overlapping the LDD region LDD is increased, a high electric field applied to the LDD region LDD may be alleviated and leakage current due to low GIDL may be reduced.

In addition to the vertical transistor structure, the dual gate electrode structure may be applied to a buried gate electrode structure.

Figure 10:
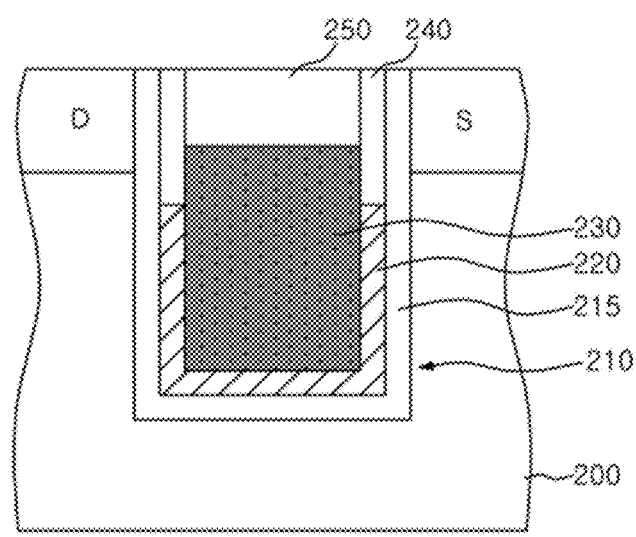

That is, as illustrated in FIG. 10, a trench 210 is formed in a semiconductor substrate 200. A source S and a drain D are formed in the semiconductor substrate 200 at both sides of the trench 210.

A first electrode 220 and a second electrode 230 may be formed in the trench 210 in which a gate insulating layer 215 is formed. The first gate electrode 220 may be formed on an inner surface of the trench 210. The first gate electrode 220 may be formed to be located substantially in a lower portion of the trench 210 so that the first gate electrode 220 may not overlap the source S and the drain D.

The second gate electrode 230 may be formed to fill the inside of the trench 210 surrounded with the first gate electrode 220. At this time, the second gate electrode 230 may be formed to have a height longer than that of the first gate electrode 220 so that the second gate electrode 230 may overlap portions of the source S and the drain D.

Although not shown in FIG. 10, it would have been obvious to a person having ordinary skill in the art that the resistive memory structure 185 illustrated in FIGS. 2 and 6 may be additionally formed. The reference numerals 240 and 250 denote insulating layers.

Therefore, a region around the drain D overlaps the second gate electrode 230 without interposing of the first gate electrode 220. Accordingly, a distance of the region around the drain affected by the high electric field to the gate electrode is substantially increased so that the GIDL effect may be reduced.

Further, since the first gate electrode 220 is formed of a material having a work function lower than that of the second gate electrode 230, an effect of the electric field on the region around the drain D, that is, a region corresponding to the LDD region LDD may be further alleviated.

Further, the second gate electrode 230 may be formed to fill the inside of the trench 210 surrounded with the first gate electrode 220.

As specifically described above, according to the exemplary embodiments, since the gate electrode having a relatively low work function is formed around the LDD region LDD, the low GIDL barrier due to application of a high electric field may be compensated and the leakage current may be reduced.

The above embodiments of the present invention are illustrative, and the invention is not limited by the embodiments described above. Various alternatives and equivalents are possible, and the invention is not limited to any specific type of semiconductor device. Other additions, subtractions, or modifications may be made in view of the present disclosure and are intended to fall within the scope of the following claims.

What is claimed is:

1. A method of manufacturing a semiconductor device, comprising:
   forming a source region in a semiconductor substrate;
   forming a semiconductor layer on the source region;
   patterning the semiconductor layer to form an active pillar;
   forming a first gate electrode to surround the active pillar;
   surrounding an upper region of the first gate electrode with an insulating layer while exposing a lower region of the first gate electrode; and
   forming a second gate electrode by increasing a work function of the exposed lower region of the first gate electrode.

2. The method of claim 1, wherein the forming of the second gate electrode includes implanting nitrogen ions into the exposed lower region of the first gate electrode.

3. The method of claim 1, wherein the forming of the second gate electrode includes:
   forming a silicon layer on the exposed lower region of the first gate electrode; and
   forming a silicide layer by reacting the first gate electrode and the silicon layer.

4. The method of claim 1, further comprising:
   forming a lower electrode on the active pillar; and
   forming a resistive memory layer on the lower electrode.

5. The method of claim 1, wherein the first gate electrode includes a transition metal layer including one selected from the group comprising titanium (Ti), tantalum (Ta), cobalt (Co), and platinum (Pt).

* * * * *